US008763525B2

(12) United States Patent
Stebbins et al.

(10) Patent No.: US 8,763,525 B2
(45) Date of Patent: Jul. 1, 2014

(54) GRAVURE PRINTING OF TRANSPARENT CONDUCTIVE FILMS CONTAINING NETWORKS OF METAL NANOPARTICLES

(75) Inventors: Mathew T. Stebbins, Woodbury, MN (US); Chaofeng Zou, Maplewood, MN (US); Jennifer C. Dawson, Center Point, OR (US); Karissa L. Eckert, Blaine, MN (US); Gary E. Labelle, Stillwater, MN (US)

(73) Assignee: Carestream Health, Inc., Rochester, NY (US)

( * ) Notice: Subject to any disclaimer, the term of this patent is extended or adjusted under 35 U.S.C. 154(b) by 29 days.

(21) Appl. No.: 13/294,355

(22) Filed: Nov. 11, 2011

(65) Prior Publication Data

US 2012/0152135 A1 Jun. 21, 2012

Related U.S. Application Data

(60) Provisional application No. 61/423,214, filed on Dec. 15, 2010.

(51) Int. Cl.
| | | |
|---|---|---|
| *B41M 1/10* | (2006.01) | |
| *H05K 1/09* | (2006.01) | |
| *H01B 1/22* | (2006.01) | |
| *H05K 3/12* | (2006.01) | |

(52) U.S. Cl.
CPC ........ *H05K 1/095* (2013.01); *H05K 2201/0248* (2013.01); *H05K 3/1275* (2013.01); *B41M 1/10* (2013.01); *H05K 2201/0108* (2013.01); *H01B 1/22* (2013.01); *H05K 2201/026* (2013.01)
USPC .......................................... 101/170; 101/491

(58) Field of Classification Search
USPC ......................................................... 101/170
See application file for complete search history.

(56) References Cited

U.S. PATENT DOCUMENTS

| | | | |
|---|---|---|---|
| 2003/0162004 A1* | 8/2003 | Mirkin et al. | 428/210 |
| 2004/0005723 A1* | 1/2004 | Empedocles et al. | 438/1 |
| 2008/0259262 A1* | 10/2008 | Jones et al. | 349/139 |
| 2008/0286447 A1* | 11/2008 | Alden et al. | 427/108 |
| 2009/0130433 A1 | 5/2009 | Takada | |
| 2010/0197068 A1* | 8/2010 | Poon et al. | 438/63 |
| 2010/0243295 A1 | 9/2010 | Allemand et al. | |
| 2010/0261013 A1* | 10/2010 | Duan et al. | 428/384 |
| 2010/0264378 A1 | 10/2010 | Naoi et al. | |
| 2010/0288531 A1* | 11/2010 | Koyama et al. | 174/126.2 |
| 2010/0301337 A1* | 12/2010 | Rider et al. | 257/57 |

OTHER PUBLICATIONS

International Search Report completed on Feb. 8, 2012 for International Application No. PCT/US2011/060492, 2 pages.
Y. Xia et al., "Shape-Controlled Synthesis of Metal Nanocrystals: Simple Chemistry Meets Complex Physics?", Nanostructures, Angew. Chem. Int. Ed., 2009, vol. 48, pp-60-103.
Gravure Process and Technology, Gravure Education Foundation and Gravure Association of America, New York, 2003, pp. 179-200.
Gravure Process and Technology, Gravure Education Foundation and Gravure Association of America, New York, 2003, pp. 337-344.

(Continued)

*Primary Examiner* — Anthony Nguyen
(74) *Attorney, Agent, or Firm* — Reed L. Christiansen

(57) ABSTRACT

Methods and compositions are disclosed and claimed for gravure printing of transparent conductive films comprising metal nanowires. Such films exhibiting low resistivity and superior coating uniformity may be used in electronic or optical articles.

7 Claims, 2 Drawing Sheets

(56) References Cited

OTHER PUBLICATIONS

Gravure Process and Technology, Gravure Education Foundation and Gravure Association of America, New York, 2003, pp. 447-463.
Gravure Process and Technology, Gravure Education Foundation and Gravure Association of America, New York, 2003, pp. 479-496.
Gravure Process and Technology, Gravure Education Foundation and Gravure Association of America, New York, 2003, pp. 499-521.
Gravure Inks, The Printing Ink Manual, Chapter 8, Leach, R.H and Pierce, R.J. ed., Blueprint, 1991 Part 1, pp. 474-495.
Gravure Inks, The Printing Ink Manual, Chapter 8, Leach, R.H and Pierce, R.J. ed., Blueprint, 1991 Part 2, pp. 496-521.
Gravure Inks, The Printing Ink Manual, Chapter 8, Leach, R.H and Pierce, R.J. ed., Blueprint, 1991 Part 3, pp. 522-546.

* cited by examiner

GRAVURE PRINTING OF TRANSPARENT CONDUCTIVE FILMS CONTAINING NETWORKS OF METAL NANOPARTICLES

CROSS REFERENCE TO RELATED APPLICATIONS

This application claims the benefit of U.S. Provisional Application No. 61/423,214, filed Dec. 15, 2010, entitled GRAVURE PRINTING OF TRANSPARENT CONDUCTIVE FILMS CONTAINING NETWORKS OF METAL NANOPARTICLES, which is hereby incorporated by reference in its entirety.

BACKGROUND

The general preparation of silver nanowires (10-200 aspect ratio) is known. See, for example, *Angew. Chem. Int. Ed.* 2009, 48, 60, Y. Xia, Y. Xiong, B. Lim, S. E. Skrabalak, which is hereby incorporated by reference in its entirety.

Gravure coating is a known coating technology, see, for example, *Gravure Process and Technology*, Gravure Education Foundation and Gravure Association of American, Quebecor World Inc., 2003, which is hereby incorporated by reference in its entirety. Rheological requirements for gravure coating solution have been described in *Gravure Inks, The Printing Ink Manual*, Chapter 8, Leach, R. H and Pierce, R. J. ed., Blueprint, 1991, which is hereby incorporated by reference in its entirety.

SUMMARY

At least some embodiments provide a method comprising providing an ink comprising nanowires, the nanowires having a distribution of lengths, the distribution having a mean $L_m$ and standard deviation $\sigma$; providing a surface and a plurality of indentations in the surface, the plurality of indentations having a density of LPI (lines/inch); transferring the ink into the plurality of indentations; and transferring at least a portion of the ink from the indentations to a printing medium, where LPI is less than about $2.5 \times 10^4$ micron lines/inch divided by $L_m + 3\sigma$. The nanowires may, for example, have aspect ratios of at least about 50, or at least about 100, or at least about 1000, or at least about 10,000. The surface may, for example, be the exterior (i.e., outward-facing) surface of a rotogravure cylinder.

In at least some embodiments, the ink may further comprise a polymer binder, such as, for example, a cellulosic polymer. When using such inks, some embodiments further provide methods where the printing medium is moving at a speed of U (feet/min) relative to the surface, the ink has a viscosity $\mu$ (cps), and LPI is greater than about $473 - 67.6 \ln(\mu \cdot \log_{10}(U))$ lines per inch.

Other embodiments provide conductive films produced according to such methods.

Yet still other embodiments provide articles comprising such transparent conductive films such as, for example, electronic displays, touch screens, portable telephones, cellular telephones, computer displays, laptop computers, tablet computers, point-of-purchase kiosks, music players, televisions, electronic games, electronic book readers, transparent electrodes, solar cells, light emitting diodes, other electronic devices, medical imaging devices, medical imaging media, and the like.

These embodiments and other variations and modifications may be better understood from the brief description of figures, figures, description, exemplary embodiments, examples, and embodiments that follow. Any embodiments provided are given only by way of illustrative example. Other desirable objectives and advantages inherently achieved may occur or become apparent to those skilled in the art.

DESCRIPTION

Figure 1:
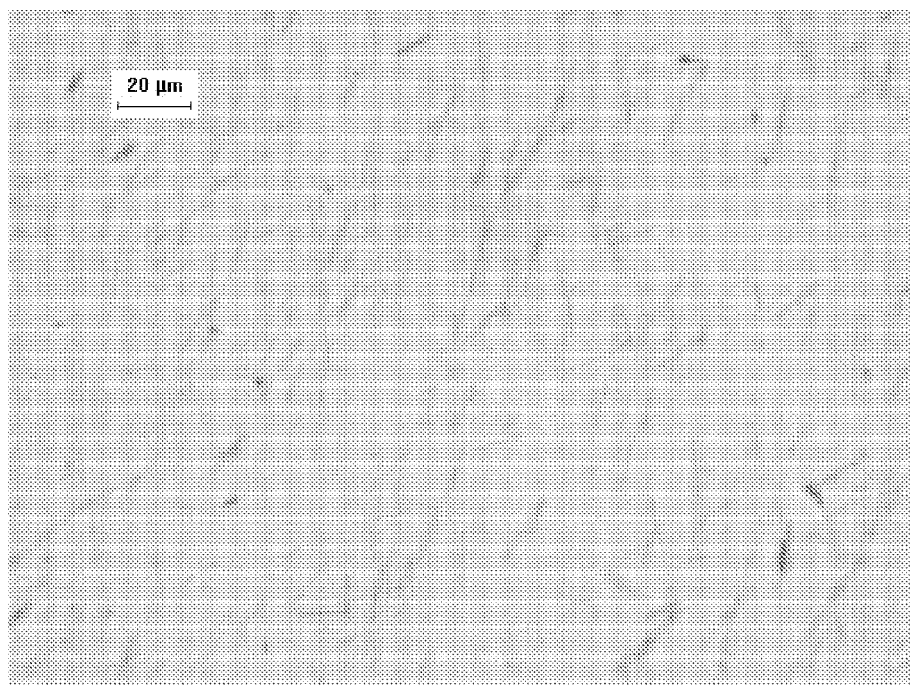
FIG. 1 shows an optical micrograph of the comparative coating sample Comp-1.

All publications, patents, and patent documents referred to in this document are incorporated by reference in their entirety, as though individually incorporated by reference.

U.S. Provisional Application No. 61/423,214, filed Dec. 15, 2010, entitled GRAVURE PRINTING OF TRANSPARENT CONDUCTIVE FILMS CONTAINING NETWORKS OF METAL NANOPARTICLES, is hereby incorporated by reference in its entirety.

Metal nanowire based transparent conductive films have attracted great attention recently due to their excellent electric conductivity, high light transmittance, and easy manufacturing on a flexible substrate. Transparent conductive films prepared through networking of silver nanowires have the potential to replace indium tin oxide as transparent conductors in many applications, such as, for example, touch screens, EMI shielding, electrochromic or LED lighting, photovoltaic solar panels, and the like. Transparent conductive films prepared from silver nanowires in organic binder can produce materials with electric resistivity as low as 10 ohm/sq with total light transmittance greater than about 85% when coated on a suitable support, such as, for example, polyethylene terephthalate (PET).

In general, such transparent conductive films can be prepared via conventional coating technologies including, for example, spray painting, dip-coating, spin-coating, knife coating, Mayer rod coating, roll coating, gravure coating, slot-die coating, slide coating, curtain coating, extrusion coating, and the like.

However, when coating dispersion solutions containing high aspect ratio metal nanowires, sometimes referred to as "one-dimensional" nanowires, wire orientation parallel to the web coating direction has been observed for several coating methods in which high shear forces are aligned with the direction of the moving web. Highly oriented wires can be less efficient in forming a conductive network due to decreased wire-to-wire contact points across the network, which can result in lower conductivity for a given coverage of metal nanowire solution. This phenomena can be aggravated when coating solution viscosity is increased.

In contrast, gravure coating or printing can be an excellent technique to print conductive networks of metal nanowire meshes on a flexible substrate, since such printing methods apply only minor amounts of shear force to the coating solution during the coating process, even when printing transparent conductive films at very high speeds. Gravure printing of very thin layers of transparent and conductive coatings can also achieve excellent uniformity, both crossweb and downweb, since the engraved recesses, or cells, on the gravure cylinder precisely define the amount of coating solution to be delivered to the web.

The ability to accurately control the cell transfer efficiency, or solution pickout efficiency, from the cells, as well as the ability to effectively merge solutions from individual cells can affect the capability for forming uniform conductive coatings with no visible cell patterns. The density of gravure cells, or lines per inch (LPI) of the gravure pattern on a given gravure cylinder, needs to be chosen to match the coating solution rheology in order to provide sufficient solution pickout efficiency, as well as coating consistency and uniformity. For low viscosity solutions, fine cylinders with higher LPI are preferred, whereas for higher viscosity solutions, coarser cylinders are preferred.

Another challenge for gravure coating of transparent conductive films is that it is difficult to prepare coatings free of local non-uniformities, such as, for example, those derived from the engraved pattern. Coating uniformity, or print appearance, is related to gravure cell design and coating solution rheology, but the relationship and optimum operation conditions are poorly understood by practitioners, especially for coating solutions containing one dimensional nanoparticles, such as, for example, high aspect ratio metal nanowires. In this case, the solution viscosity and cell size are two parameters to consider when choosing a gravure cylinder.

Applicants have recognized that for coating of dispersion solutions containing one-dimensional metal nanowires, knowledge of the metal nanowire length distribution can be taken into account in selecting the appropriate gravure cylinder pattern and cell size. When the gravure cell opening size approaches the average wire length size plus the standard deviation of the length distribution, the gravure cells can behave like an effective filter that allows only small amounts of short wires to be incorporated into the grooves. The resulting coating, though similar in wet lay down, would show little or no conductivity due to the diminished fraction of longer wires. In contrast, use of gravure cylinders with larger cell opening sizes can allow nanowires to enter gravure cells without such severe skewing of the wire size distributions in the cells.

Applicants have also discovered that in order to achieve sufficient cell transfer efficiency and to achieve high lay down uniformity, for a metal nanowire dispersion solution containing thermosetting polymer binder, the coating solution rheology should also be considered. In some embodiments, the preferred gravure cylinder cell density for printing one-dimensional nanoparticle solutions, expressed in lines per inch (LPI), is provided by the combined inequalities of the equations:

$$\text{LPI} \geq A - B \ln(\mu \cdot \text{Log}_{10}(U)) \quad \text{Equation (1a)}$$

$$\text{LPI} \leq C/(L_m + 3\sigma) \quad \text{Equation (1b)}$$

in which:
A and B are constants specific to the polymer binder and solvent composition.
C is a constant specific to the gravure cell pattern.
$\mu$ is the coating solution viscosity in centipoises.
U is gravure coating web speed, in feet per minute.
$L_m$ and $\sigma$ are the average length and standard deviation, respectively, of the one-dimensional nano-particles employed in the coating solution, in microns ($\mu$m).

For a system with cellulose acetate butyrate binder in organic solvents, the following parameters have been established from our experiments:
A=473 lines per inch and B=67.6 lines per inch These parameters should be applicable to inks comprising other polymer binders, such as other cellulosic polymers. Cellulosic polymers are polysaccharides or derivatives of polysaccharides, that may have degrees of polymerization of, for example, 100, 1000, 10,000, or more. These include derivatives of cellulose, such as, for example, esters and ethers of cellulose. Cellulosic esters include cellulose acetates, such as, for example, cellulose acetate, cellulose triacetate, cellulose propionate, cellulose acetate propionate, cellulose acetate butyrate (CAB), and the like. Cellulosic ethers include, for example, methylcellulose, ethylcellulose, ethyl methyl cellulose, hydroxyethyl cellulose, hydroxypropyl cellulose, hydroxyethyl methyl cellulose, hydroxypropyl methyl cellulose, ethyl hydroxyethyl cellulose, carboxymethyl cellulose, and the like. These and other such cellulosic polymers will be understood by those skilled in the art.

For the experimental system used in the examples, the constant C was determined to be:

$$C = 2.5 \times 10^4 \, \mu\text{m} \cdot \text{lines per inch}$$

EXEMPLARY EMBODIMENTS

U.S. Provisional Application No. 61/423,214, filed Dec. 15, 2010, entitled GRAVURE PRINTING OF TRANSPARENT CONDUCTIVE FILMS CONTAINING NETWORKS OF METAL NANOPARTICLES, which is hereby incorporated by reference in its entirety, disclosed the following eight exemplary embodiments:

A. A method comprising:
preparing an ink comprising nanowires, said nanowires having a distribution of lengths, said distribution having a mean $L_m$ and standard deviation $\sigma$;
providing a surface and a plurality of indentations in the surface, said plurality of indentations having a density of LPI (lines/inch);
transferring the ink into the plurality of indentations; and
transferring at least a portion of the ink from the indentations to a printing medium, wherein LPI is less than about $2.5 \times 10^4$ micron lines/inch divided by $L_m + 3\sigma$.

B. The method according to embodiment A, wherein the nanowires have an aspect ratio greater than about 50.

C. The method according to embodiment A, wherein the ink further comprises a polymer binder.

D. The method according to embodiment C, wherein the polymer binder comprises at least one cellulosic polymer.

E. The method according to embodiment C, wherein the printing medium is moving at a speed of U (feet/min) relative to the surface, the ink has a viscosity $\mu$ (cps), and LPI is greater than about $473 - 67.6 \ln(\mu \cdot \log_{10}(U))$ lines per inch.

F. The method according to embodiment A, wherein the surface is an exterior surface of a rotogravure cylinder.

G. A conductive film produced according to the method of embodiment A.

H. An article comprising the conductive film according to embodiment G.

EXAMPLES

Example 1

Silver nanowire dispersion solutions comprising the following ingredients were prepared:
Silver nanowires (Blue Nano, Charlotte, N.C.)
Cellulose acetate butyrate (EASTMAN® CAB 171-15i, Eastman Chemical)
Aliphatic polyisocyanate (DESMODUR® N3300, Bayer)
Bismuth neodecanoate (Aldrich)
Methyl ethyl ketone (MEK), ethyl lactate, isopropanol These solutions were coated on 7-mil clear polyethylene terephthalate (PET) supports using gravure cylinders of varying lines per inch (LPI). The coating solution viscosity was adjusted by changing the percent solids of the coating solutions. The resulting data are summarized in Table I.

Referring to Table I, Samples Inv-1 through Inv-6 exhibited excellent coating quality and good conductivity. Sample Comp-1 was non-conductive, while Samples Comp-2 and Comp-3 exhibited poor coating quality. Accordingly, Samples Inv-1 through Inv-6 satisfied the conditions of both Eqn. (1a) and Eqn. (1b).

Sample Comp-1 is depicted in FIG. 1. As shown in Table 1, coating quality was only fair and this film was not conductive. This is believed to be due to poor inclusion of nanowires from the dispersion solution. Note that Sample Comp-1 did not satisfy the conditions of either Eqn. (1a) or Eqn. (1b).

Samples Comp-2 and Comp-3 were coated with coarse cylinders to attempt to improve inclusion of nanowires into the cells. However, their coating viscosities appeared to be too low for efficient solution pick up and transfer, resulting in poor print quality. Note that Samples Comp-2 and Comp-3 did not satisfy the conditions of Eqn. (1a).

Figure 2:
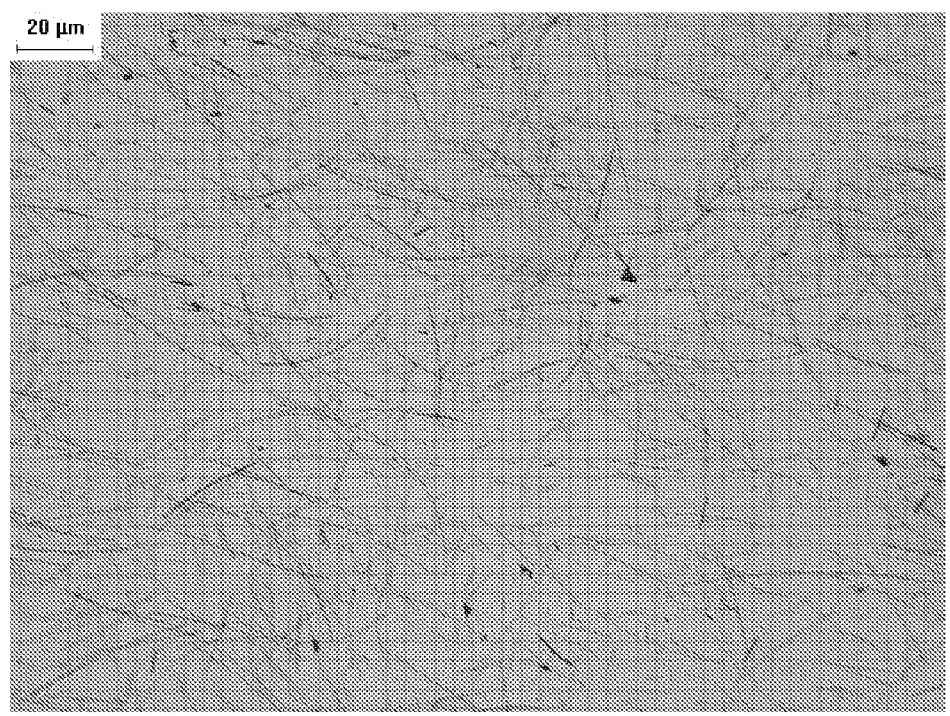
FIG. 2 shows an optical micrograph of the inventive coating sample Inv-1.

In comparison, when using gravure cylinders with larger cell opening sizes, nanowires were filled into the gravure cells with wire size distributions similar to that in the coating solution, as shown for sample Inv-1 in FIG. 2. Because the coating solution viscosity was sufficiently high, the coating quality was also excellent.

Example 2

Silver nanowire dispersion solutions comprising the following ingredients were prepared:

Silver nanowires (51 nm±5.4 average diameter, 23.5±10.0 μm average length, based on measurement of at least 100 wires)

Cellulose acetate butyrate (EASTMAN® CAB 381-20, Eastman Chemical)

Propyl acetate, ethyl lactate, isopropanol

These solutions were coated on 7-mil clear polyethylene terephthalate (PET) supports using gravure cylinders of varying lines per inch (LPI). The coating solution viscosity was adjusted by changing the percent solids of the coating solutions. The resulting data are summarized in Table II. Samples exhibiting excellent resistivity and coating properties were produced.

The invention has been described in detail with reference to particular embodiments, but it will be understood that variations and modifications can be effected within the spirit and scope of the invention. The presently disclosed embodiments are therefore considered in all respects to be illustrative and not restrictive. The scope of the invention is indicated by the appended enumerated embodiments, and all changes that come within the meaning and range of equivalents thereof are intended to be embraced therein.

TABLE I

| ID# | $\mu$ (cps) | $L_m$ (μm) | $\sigma$ (μm) | LPI (lines/ inch) | U (ft/ min) | Resistivity (ohms/sq) | Coating Quality |
|---|---|---|---|---|---|---|---|
| Comp-1 | 15 | 90 | 25 | 260 | 20 | Non-conductive | Fair |
| Comp-2 | 40 | 90 | 25 | 150 | 20 | 110 | Poor, striped patterns |
| Comp-3 | 15 | 106 | 34 | 44 | 50 | 140 | Poor, non-uniform patch |
| Inv-1 | 75 | 29 | 25 | 150 | 70 | 124 | Excellent |
| Inv-2 | 85 | 29 | 25 | 165 | 50 | 115 | Excellent |
| Inv-3 | 120 | 29 | 25 | 140 | 100 | 60 | Excellent |
| Inv-4 | 85 | 22 | 18 | 180 | 100 | 170 | Excellent |
| Inv-5 | 45 | 22 | 18 | 180 | 200 | 290 | Excellent |
| Inv-6 | 45 | 22 | 18 | 160 | 200 | 110 | Excellent |

TABLE II

| ID# | $\mu$ (cps) | $L_m$ (μm) | $\sigma$ (μm) | LPI (lines/ inch) | U (ft/ min) | Resistivity (ohms/sq) | Coating Quality |
|---|---|---|---|---|---|---|---|
| 2-1 | 20 | 23.5 | 10 | 320 | 100 | 120 | Poor, grainy |
| 2-2 | 40 | 23.5 | 10 | 320 | 100 | 70 | Fair, sporadic cell pattern |
| 2-3 | 55 | 23.5 | 10 | 320 | 100 | 55 | Good |
| 2-4 | 65 | 23.5 | 10 | 320 | 100 | 41 | Excellent |
| 2-5 | 85 | 23.5 | 10 | 320 | 100 | 46 | Pronounced cell pattern |

We claim:

1. A method comprising:
providing an ink comprising nanowires, said nanowires having a distribution of lengths, said distribution having a mean $L_m$ and standard deviation $\sigma$;
providing a surface and a plurality of indentations in the surface, said plurality of indentations having a density of LPI (lines/inch);
transferring the ink into the plurality of indentations; and
transferring at least a portion of the ink from the indentations to a printing medium, wherein LPI is less than about $2.5 \times 10^4$ μm lines/inch divided by $L_m + 3\sigma$.

2. The method according to claim 1, wherein at least some of the nanowires have an aspect ratio greater than about 50.

3. The method according to claim 1, wherein the ink further comprises a polymer binder.

4. The method according to claim 3, wherein the polymer binder comprises at least one cellulosic polymer.

5. The method according to claim 3, wherein the printing medium is moving at a speed of U (feet/min) relative to the surface, the ink has a viscosity μ (cps), and LPI is greater than about $473 - 67.6 \ln(\mu \cdot \log_{10}(U))$ lines per inch.

6. The method according to claim 1, wherein the surface is an exterior surface of a rotogravure cylinder.

7. The method according to claim 1, wherein the printing medium is a conductive film.

* * * * *